United States Patent [19]
Koyama

[11] Patent Number: 5,451,819
[45] Date of Patent: Sep. 19, 1995

[54] SEMICONDUCTOR DEVICE HAVING CONDUCTIVE PLUG PROJECTING FROM CONTACT HOLE AND CONNECTED AT SIDE SURFACE THEREOF TO WIRING LAYER

[75] Inventor: Kuniaki Koyama, Tokyo, Japan
[73] Assignee: NEC Corporation, Tokyo, Japan
[21] Appl. No.: 71,387
[22] Filed: Jun. 2, 1993

[30] Foreign Application Priority Data
Jun. 8, 1992 [JP] Japan .................. 4-147187

[51] Int. Cl.$^6$ ............ H01L 23/48; H01L 29/46; H01L 29/54; H01L 29/62
[52] U.S. Cl. .................. 257/758; 257/759; 257/760; 257/763; 257/764; 257/774
[58] Field of Search .......... 257/666, 758, 759, 760, 257/763, 764, 774

[56] References Cited
U.S. PATENT DOCUMENTS
4,914,056  4/1990  Okumura .................. 257/774

FOREIGN PATENT DOCUMENTS
57-37829  3/1982  Japan .
58-34916  3/1983  Japan .
59-161049  9/1984  Japan .................. 257/774

Primary Examiner—Sara W. Crane
Assistant Examiner—Carl Whitehead, Jr.
Attorney, Agent, or Firm—Young & Thompson

[57] ABSTRACT

A semiconductor device adapted for reduction in size and increasing density is disclosed. The semiconductor device comprises an insulating layer having therein a contact hole in which a first conductive layer or a contact electrode is deposited for connecting a semiconductor active region with an overlying second conductive layer. The contact electrode has a top portion protruding from the insulating layer and a side surface in contact with the second conductive layer for increasing a contact area between the contact electrode and the second conductive layer. The top surface of the contact electrode may be provided with an insulating layer between the top surface and the interconnection wiring layer formed from the second conductive layer in order to avoid etching of the contact electrode and underlying semiconductor active region during etching of the second conductive layer, even in the case of misalignment of the contact electrode with the interconnection wiring layer.

8 Claims, 5 Drawing Sheets

SEMICONDUCTOR DEVICE HAVING CONDUCTIVE PLUG PROJECTING FROM CONTACT HOLE AND CONNECTED AT SIDE SURFACE THEREOF TO WIRING LAYER

BACKGROUND OF THE INVENTION (a) Field of the Invention

The present invention relates to a semiconductor device and, more particularly, to an improvement in contact structure connecting an active region to a wiring layer or in a through-hole structure for interconnecting a lower and an upper wiring layers.

(b) Description of the Related Art

Recently, a contact electrode or through-hole in a semiconductor device has been made smaller in a cross sectional view for increasing the integration density of the semiconductor device. Conductive layers for interconnection wiring patterns to be electrically connected to the contact electrodes have also been made smaller in line width and in a gap between adjacent lines.

Accordingly, it is a critical factor in the miniaturization of a semiconductor device to obtain a sufficient contact area for connecting the contact electrode or through-hole with the overlying interconnection wiring layer.

It is also an extremely important factor in the miniaturization of a semiconductor device to reduce a margin area while assuring an alignment between the contact electrode or through-hole and the overlying interconnection wiring layer, even when an avoidable misregistration or size variation occurs during the fabrication process.

In short, miniaturization of the semiconductor device is restricted to a certain degree by the necessary contact area between the contact electrode or through-hole and the overlying interconnection wiring layer and by the necessary margin area for an alignment between the contact electrode and the overlying interconnection wiring layer.

OBJECTS OF THE INVENTION

In view of foregoing, it is an object of the present invention to provide a semiconductor device in which a sufficient contact area can be obtained between a contact electrode or a through-hole and an overlying conductive layer forming an interconnection wiring layer.

Further, it is another object of the present invention to provide a semiconductor device having an improved contact hole or through-hole structure which allows an overlying conductive layer to misalign with the hole.

SUMMARY OF THE INVENTION

A semiconductor device according to the present invention comprises a semiconductor substrate, an insulating layer covering the substrate and having a hole, a conductive plug formed to fill the hole and to have a top portion protruding from the insulating layer and having a top and a side surface, an insulating film formed on the top surface of the top portion without covering the side surface thereof, and a conductive layer formed in electrical contact with the side surface of the top portion of the conductive plug and elongated over the insulating layer.

With the above structure, since the top portion of the conductive plug protrudes from the insulating layer into the conductive wiring layer and the side surface of the top portion of the conductive plug is in electrical contact with the conductive layer, a sufficient contact area between the conductive plug and the conductive wiring layer can be obtained even when the size of the contact hole is made small.

Moreover, since the top surface of the conductive plug is covered by the insulating film, the conductive plug is not etched during the etching step of the conductive layer, even if the top surface of the conductive plug is not covered entirely by the pattern of the conductive wiring layer due to misalignment between the conductive wiring layer and the conductive plug. Hence, according to the present invention, such a misalignment will less restrict the miniaturization of the semiconductor device.

BRIEF DESCRIPTION OF THE DRAWINGS

The above and other objects, features and advantages of the present invention will be more apparent from the following description, referring to the accompanying drawings in which.

DETAILED DESCRIPTION OF THE PREFERRED EMBODIMENTS

For the sake of facilitating the understanding of the present invention, a conventional semiconductor device and a method for manufacturing the same will be first described with reference to FIGS. 1A to 1D.

Figure 1A:
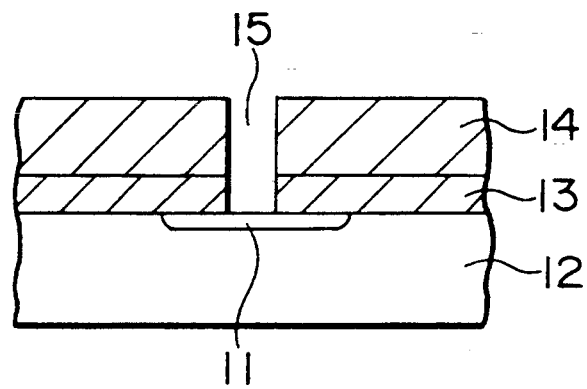
FIGS. 1A to 1D are cross-sectional views of a conventional semiconductor device, each consecutively showing a step for manufacturing the semiconductor device.

In FIG. 1A, a semiconductor substrate 12 of a first conductive type, a p-type silicon substrate, for example, is prepared. A region of a second conductive type, i.e., an n-type diffusion region 11 is selectively formed as a semiconductor active region in the p-type substrate 12 by ion-implanting. A silicon oxide layer 13 of a thickness of, for example, about 5000 angstroms and a photoresist layer 14 are consecutively formed on the substrate 12. Then, a contact hole 15 is formed in the silicon oxide layer 13 to expose a part of the diffusion region 11 by selectively etching the silicon oxide layer 13 by using the photoresist layer 14 as a mask.

Figure 1B:
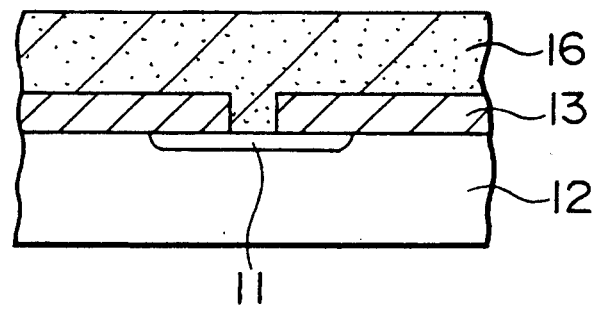
Figure 1C:
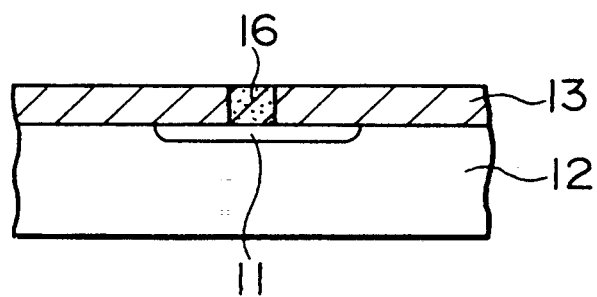
Figure 1D:
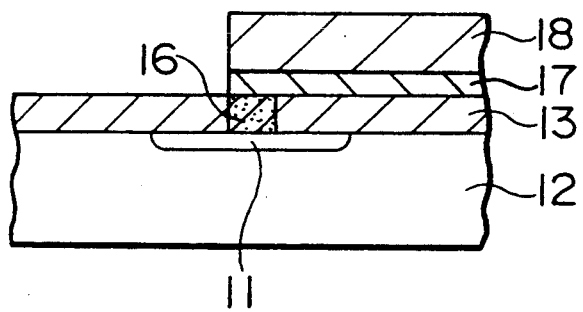

Next, the photoresist layer 14 is removed and a first conductive layer 16 of polycrystalline silicon is then formed by, for example, a chemical vapor deposition (CVD) technology on the silicon oxide layer 13 with filling up the contact hole 15, as shown in FIG. 1B. The first conductive layer 16 is then etched back by, for example, reactive plasma etching to leave the portion of the conductive layer 16 only in the contact hole 15 as shown in FIG. 1C. The etching back is carried out until the silicon oxide layer 13 appears and is detected. The first conductive layer is thus formed as a contact electrode 16. Then, a conductive layer 17 of aluminum is deposited on the oxide layer 13 and the top surface of the contact plug 16 by, for example, sputterring, followed by selectively etching the aluminum layer 17 by use of a photoresist layer as a mask to form an aluminum interconnection wiring layer 17. Hence, the diffusion layer 11 is electrically connected to the conductive layer 17 through the contact electrode 16 as shown in FIG. 1D.

With the method as described above, the depositing and etching back is performed for obtaining a flat surface in which the top surface of the the contact electrode 16 is flush with the silicon oxide layer 13 for avoiding a disconnection of the aluminum interconnection wiring layer.

Since the semiconductor device has been increasingly reduced in its size, the contact hole has been also reduced in its cross section down to, for example, 0.5 $\mu m \times 0.5 \mu m$ or less. With such a size, the contact area between the contact electrode 16 and the aluminum layer 17 will not be sufficient in some cases.

Moreover, if the aluminum interconnection wiring layer obtained by patterning the aluminum layer is not aligned with the contact electrodes 16 to be connected thereto, the contact area is further reduced. In this case, the selective etching of the aluminum layer 17 will etch also the contact electrode 16 as well as the underlying diffusion region 11. If the diffusion region 11 is etched during the etching process, a leakage current flowing through the p-n junction between the the substrate 12 and the diffusion region 11 may occur, degrading the characteristics of the semiconductor device. The present invention resolves these problems by employing a construction as described hereinafter.

Figure 2A:
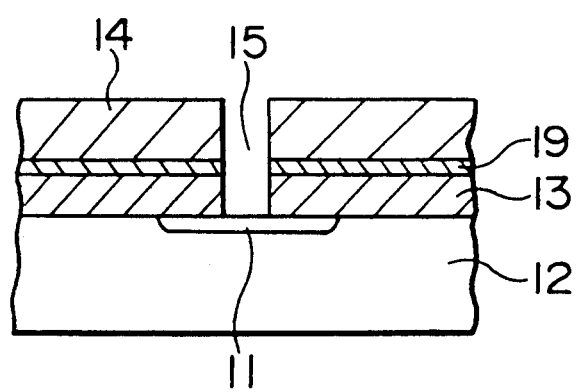
FIGS. 2A to 2F are cross-sectional views illustrative of the steps of producing a semiconductor device according to a first embodiment of the present invention.

Turning now to FIG. 2 illustrative of an embodiment of the present invention, FIG. 2A shows a semiconductor silicon substrate 12 of a first conductive type (a p-type, for example) and an active region 11 of a second conductive type (i.e., an n-type) selectively formed therein. An insulating layer, for example, a silicon oxide layer 13 of a thickness of about 5000 angstroms and a protective layer or another insulating layer 19 of, for example, silicon nitride of a thickness of about 2000 angstroms are consecutively deposited on the substrate 12. Then, a photoresist layer 14 is formed on the silicon nitride layer 19 as a mask for selectively etching the silicon nitride layer 19 and the silicon oxide layer 13 to form a contact hole 15 for exposing a portion of the n-type diffusion region 11, as shown in FIG. 2A. The protective layer may be of any material which can be selectively etched from the silicon oxide layer.

Figure 2B:
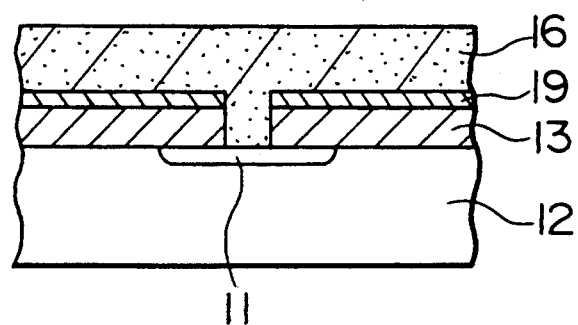

Next, the photoresist layer 14 is removed and a first conductive layer 16 of polycrystalline silicon is then deposited, for example, of a thickness of about 1.0 $\mu m$ by CVD on the silicon nitride layer 19 with filling the contact hole 15 and extending over the film 19, as shown in FIG. 2B. The thickness of about 1.0 $\mu m$ may be sufficient for filling the polycrystalline layer into the contact hole of a 0.5 $\mu m \times 0.5 \mu m$ cross area without an insufficient deposition.

Figure 2C:
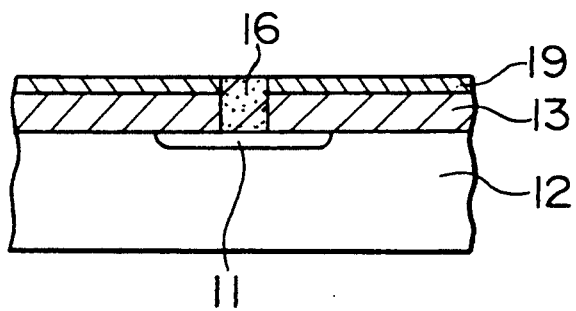
Figure 2D:
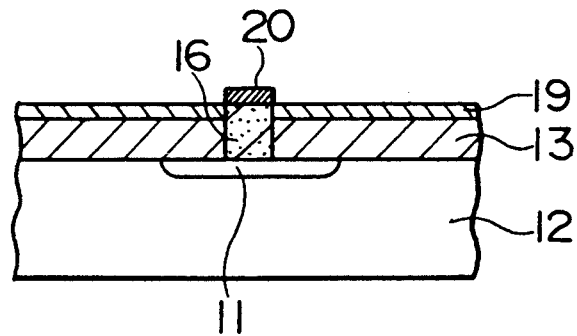
Figure 2E:
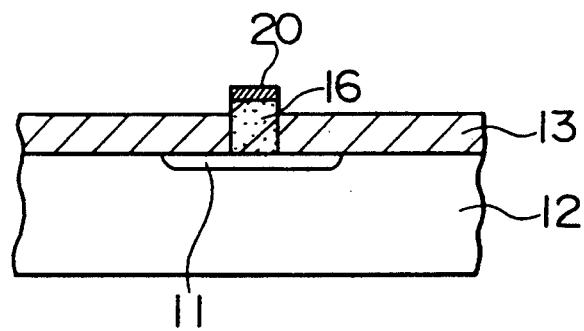

The polycrystalline silicon layer 16 on the silicon nitride layer 19 is then etched back to leave the portion of the polycrystalline silicon layer as a contact electrode or plug 16 formed only within the contact hole 15 as shown in FIG. 2C. Next, the contact plug 16 is oxidized at the top thereof to form a silicon oxide layer as a top insulating layer 20 of a thickness, for example, 500 angstroms as shown in FIG. 2D. The reduction of the length of the contact plug 16 due to the oxidization will be less than 200 angstroms. The silicon nitride layer 19 is then removed by etching using an aqueous phosphoric acid, leaving the top portion of the contact plug 16 and the top insulating layer 20 protruding from the contact hole of the first insulating layer 13, as shown in FIG. 2E.

Figure 2F:
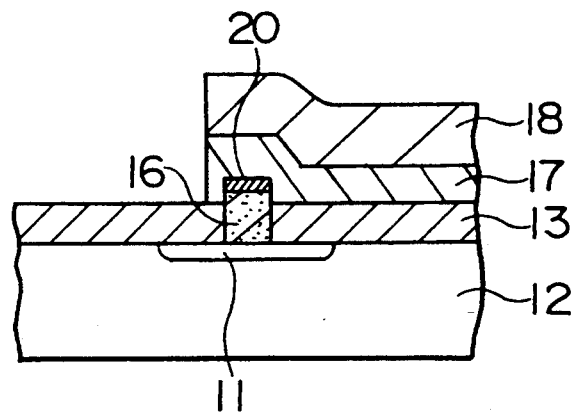

Next, a conductive layer 17 is formed of a thickness of about 5000 angstroms by sputterring aluminum onto the first insulating layer 13, top insulating layer 20 and the top portion of the contact plug 16, then patterned by, for example, reactive plasma etching under a chlorine gas atmosphere using a photoresist layer 18 as a mask, as shown in FIG. 2F. The aluminum interconnection wiring layer 17 is electrically connected to the contact plug 16 at the side surface of the top portion of the contact plug 16 so that a sufficient contact area can be obtained between the contact plug 16 and the aluminum interconnection wiring layer 17.

Even if a misalignment between the aluminum interconnection wiring layer 17 and the contact plug 16 should arise, since the top surface of the contact plug 16 is provided with the top insulating layer 20, the contact plug 16 and hence the diffusion region 11 will not be etched during the etching step of the aluminum layer 17. Accordingly, a leakage current degrading the characteristics of the semiconductor device will not flow through the junction between the substrate 12 and the diffusion region 11.

Figure 3A:
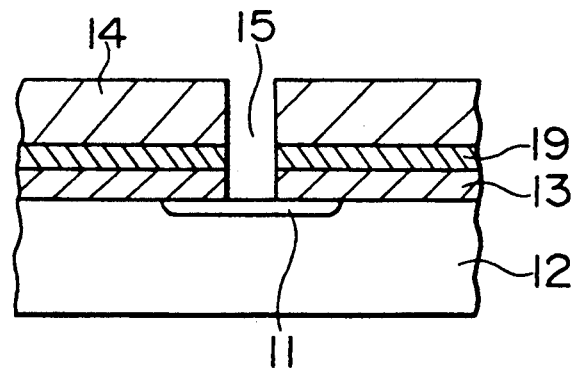
FIGS. 3A to 3E are cross-sectional views illustrative of steps for manufacturing another semiconductor device according to a second embodiment of the present invention.

FIGS. 3A to 3D show another method for manufacturing a semiconductor device according to a second embodiment of the present invention. In FIG. 3A, an n-type diffusion region 11 is formed within a substrate 12 by ion-implanting. A first insulating layer 13 of, for example, silicon oxide of a thickness of about 4000 angstroms is deposited, following which a protective layer 19 or a second insulating layer 19 of, for example, silicon nitride is deposited of a thickness of 3000 angstroms on the silicon oxide layer 13. Next, the silicon oxide layer 13 and the silicon nitride layer 19 are selectively etched to form a contact hole 15 therethrough above the n-type diffusion region 11 using a photoresist layer 14 as a mask.

Figure 3B:
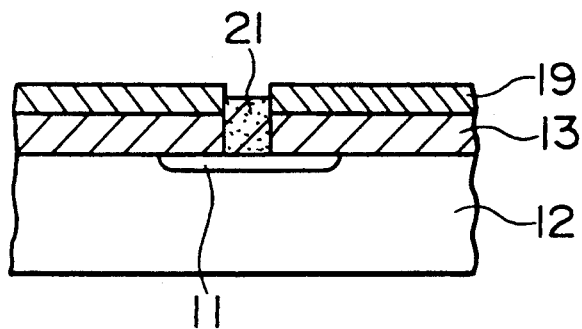
Figure 3C:
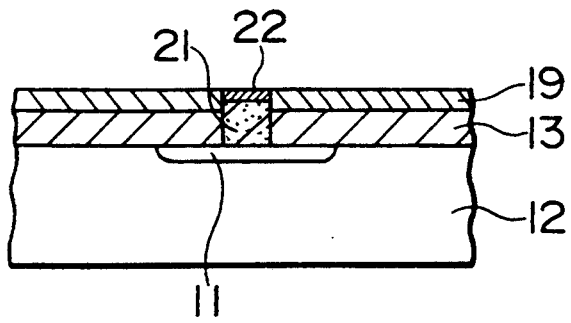
Figure 3D:
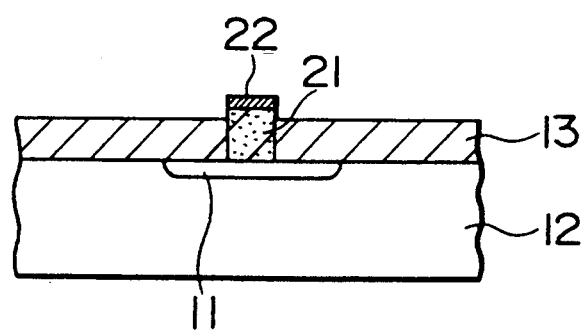

Then, a metal contact plug 21 of tungsten of a thickness of 6000 angstroms is selectively grown on the n-type diffusion region 11 as a conductive plug within the contact hole 15 as shown in FIG. 3B. A third insulating layer 22 of silicon oxide is deposited by a CVD technology of a thickness of about 4000 angstroms on the silicon nitride layer 19 and the top of the contact plug 21, then the third insulating layer 22 deposited on the second insulating layer 19 is selectively etched leaving the portion of the third insulating layer 22 deposited on the top surface of the contact plug 21 as shown in FIG. 3C. Next, the silicon nitride layer 19 is removed by etching using an aqueous phosphoric acid as an etchant leaving the top portion of the contact plug 21 and the top insulating layer 22 protruding from the contact hole of the first insulating layer 13 as shown in FIG. 3D.

Figure 3E:
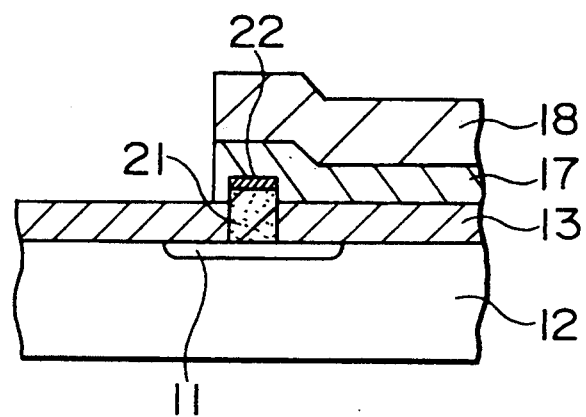

A conductive layer of aluminum is then deposited by sputterring of a thickness of about 5000 angstroms on the first insulating layer 13 and the top insulating layer 22, then patterned to form an interconnection wiring layer 17 using a photoresist 18 as a mask (FIG. 3E). In this embodiment, since the tungsten contact plug 21 cannot be oxidized, the third insulating layer 22 is formed by deposition, in contrast to the top insulating layer 20 of the first embodiment.

Since the tungsten contact plug 21 is in electrical contact with the aluminum interconnection 17 at the side surfaces of the contact plug 21, the contact area between the contact plug 21 and the interconnection wiring layer 17 is sufficient. Even if a misalignment between the contact plug 21 and the aluminum wiring layer 17 should arise, the contact plug 21 and the diffusion region 11 will not be etched during etching of the aluminum layer 17 by reactive plasma etching under a chlorine gas, so that reliable characteristics of a semiconductor device can be obtained.

With the first and the second embodiment, the stepwise structure between the protrusion of the top portion of the contact plug 16 or 21 and the adjacent insulating layer 13 will not result in disconnection of the overlying conductive layer 17 even if the contact plug 16 or 21 is small in cross section, so long as the overlying conductive layer 17 is of a sufficient thickness.

The first insulating layer and the top insulating layer may be of any insulating material and the conductive plug and the conductive wiring layer may be of any conductive material as well.

Since the above embodiments are described only for examples, the present invention is not limited to such embodiments and it will be obvious to those skilled in the art that various modifications or alterations can be easily made based on the above embodiments within the scope of the present invention.

What is claimed is:

1. A semiconductor device comprising: a semiconductor substrate;
    an insulating layer covering said semiconductor substrate and having a hole;
    a first conductive layer formed to fill said hole and to have a top portion protruding from said hole and having a top surface and a side surface;
    an insulating film formed on said top surface of said top portion of said first conductive layer without covering said side surface thereof; and
    a second conductive layer formed to cover said top portion of said first conductive layer and extending over said insulating layer, said side surface of said top portion of said first conductive layer being in electrical contact with said second conductive layer.

2. The semiconductor device as defined in claim 1 wherein said first conductive layer comprises polycrystalline silicon.

3. The semiconductor device as defined in claim 1 wherein said first conductive layer comprises a metal.

4. The semiconductor device as defined in claim 3 wherein said metal comprises tungsten.

5. A semiconductor device comprising a semiconductor substrate, an active region formed in said semiconductor substrate, an insulating layer covering said semiconductor substrate and said active region and having a contact hole formed in said insulating layer to expose a part of said active region, a conductive plug filling said contact hole in contact with said active region and projecting from said contact hole to thereby form a projecting portion having a top surface and a side surface, an insulating film formed on the top surface of said projecting portion of said conductive plug, the side surface of said projecting portion of said conductive plug being free from being covered by any one of said insulating layer and said insulating film, and a conductive wiring layer formed on said insulating film in contact with the side surface of said projecting portion of said conductive plug and extending over said insulating layer.

6. The semiconductor device as defined in claim 5, wherein said conductive wiring layer is in contact with all of the side surface of said projecting portion of said conductive plug.

7. The semiconductor device as defined in claim 6, wherein said conductive plug includes a polycrystalline silicon layer.

8. The semiconductor device as defined in claim 1, wherein said conductive plug includes a tungsten layer.

* * * * *